United States Patent
Yoo

(10) Patent No.: US 7,804,596 B2
(45) Date of Patent: Sep. 28, 2010

(54) OVERLAY KEY, METHOD OF FORMING THE OVERLAY KEY AND METHOD OF MEASURING OVERLAY ACCURACY USING THE OVERLAY KEY

(75) Inventor: Do-Yul Yoo, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 982 days.

(21) Appl. No.: 11/527,592

(22) Filed: Sep. 27, 2006

(65) Prior Publication Data

US 2007/0077503 A1 Apr. 5, 2007

(30) Foreign Application Priority Data

Oct. 1, 2005 (KR) ...................... 10-2005-0092637

(51) Int. Cl.
*G01B 11/00* (2006.01)
*G01B 11/02* (2006.01)

(52) U.S. Cl. ...................... 356/401; 356/508
(58) Field of Classification Search ....................... None
See application file for complete search history.

(56) References Cited

U.S. PATENT DOCUMENTS

| 5,438,413 | A | * | 8/1995 | Mazor et al. | 356/508 |
| 5,808,742 | A | * | 9/1998 | Everett et al. | 356/509 |
| 6,150,231 | A | * | 11/2000 | Muller et al. | 438/401 |
| 6,552,798 | B2 | * | 4/2003 | Ina et al. | 356/493 |
| 6,710,876 | B1 | * | 3/2004 | Nikoonahad et al. | 356/401 |
| 6,809,827 | B2 | * | 10/2004 | Kreuzer | 356/508 |
| 7,009,704 | B1 | * | 3/2006 | Nikoonahad et al. | 356/401 |

FOREIGN PATENT DOCUMENTS

| CN | 1239322 | 12/1999 |
| CN | 1445819 | 10/2003 |
| JP | 10-186634 | 7/1998 |
| JP | 2002-246285 | 8/2002 |
| KR | 1020020072044 A | 9/2002 |
| KR | 1020040046854 A | 6/2004 |
| WO | WO 2004/090978 | 10/2004 |

OTHER PUBLICATIONS

Chinese Office Action dated Apr. 9, 2009 for corresponding Chinese Application No. 2006101420180.
Office Action in the corresponding Korean Application No. 2005-92637 dated Oct. 23, 2006.

* cited by examiner

*Primary Examiner*—Tarifur Chowdhury
*Assistant Examiner*—Gordon J Stock, Jr.
(74) *Attorney, Agent, or Firm*—Harness, Dickey & Pierce, P.L.C.

(57) ABSTRACT

In an overlay key used for measuring overlay accuracy between first and second layers on a substrate, a first mark may be formed in the first layer, and a second mark may be formed on the second layer. The first mark may include first patterns having a first pitch and extending in a first direction. The second mark may include second patterns extending in substantially the same direction as the first direction and having a second pitch substantially equal to the first pitch. First and second images may be acquired from the first and second marks. The overlay accuracy may be produced from position information of first and second interference fringes formed by overlaying a test image having a third pitch onto the first and second images.

8 Claims, 16 Drawing Sheets

OVERLAY KEY, METHOD OF FORMING THE OVERLAY KEY AND METHOD OF MEASURING OVERLAY ACCURACY USING THE OVERLAY KEY

PRIORITY STATEMENT

This application claims the benefit of priority under 35 USC §119 to Korean Patent Application No. 2005-92637 filed on Oct. 1, 2005, the entire contents of which are incorporated herein by reference.

BACKGROUND OF THE INVENTION

1. Field of the Invention

Example embodiments relate to an overlay key used in a semiconductor manufacturing process. More particularly, example embodiments relate to an overlay key for measuring overlay accuracy between patterned layers stacked on a semiconductor substrate, method of forming the overlay key and method of measuring the overlay accuracy using the overlay key.

2. Description of the Related Art

Generally, a semiconductor device is manufactured by repeatedly forming patterned layers on a semiconductor substrate such as a silicon wafer, for example. The patterned layers may be formed by one or more layer formation processes including, but not limited to, a chemical vapor deposition (CVD) process, a physical vapor deposition (PVD) process, an atomic layer deposition, etc., and may be patterned by a photolithography process and/or an etching process, for example.

The overlay accuracy between the patterned layers may be measured using an overlay key formed in the patterned layers. In general, a conventional overlay key may include a lower overlay pattern formed in a lower layer and an upper overlay pattern formed on an upper layer. A conventional overlay key may have a box-in-box shape.

The overlay accuracy may be determined by measuring the alignment accuracy between the lower and upper overlay patterns, and an alignment correction value between a semiconductor substrate and a photo mask (or reticle) may be determined according to the overlay accuracy in a photolithography process.

As the packing density of semiconductor devices increase, the significance of measuring the overlay accuracy generally increases.

SUMMARY

Example embodiments provide an advanced form of an overlay key to improve measurement of overlay accuracy.

Example embodiments provide a method of forming an advanced overlay key.

Example embodiments also provide a method of measuring overlay accuracy using an overlay key.

In an example embodiment, an overlay key may be used for measuring overlay accuracy between a first layer and a second layer on a substrate. An example embodiment of an overlay key may include a first mark formed in the first layer and having first patterns with a first pitch extending in a first direction; and a second mark formed on the second layer adjacent to the first mark and having second patterns with a second pitch substantially equal to the first pitch and extending in a substantially same direction as the first direction.

In some example embodiments, the second mark may be disposed adjacent to the first mark in the first direction.

In some example embodiments, the second mark may be disposed adjacent to the first mark in a second direction substantially perpendicular to the first direction.

In some example embodiments, the first and second patterns may be arranged such that each of the first and second marks has a rectangular box shape. The first and second marks may be arranged such that a side portion of the first mark is adjacent to a side portion of the second mark.

In another example embodiment, an overlay key may be used for measuring overlay accuracy between a first layer and a second layer on a substrate. In addition, the overlay key may include a first mark having first patterns with a first pitch extending in a first direction; a second mark having second patterns formed in the first layer with a second pitch and extending in a second direction substantially perpendicular to the first direction; a third mark having third patterns formed on the second layer adjacent to the first mark, extending substantially the same direction as the first direction, and having a third pitch substantially equal to the first pitch; and a fourth mark formed on the second layer adjacent to the second mark and having fourth patterns with a fourth pitch substantially equal to the second pitch and extending in substantially the same direction the second direction.

In some example embodiments, the third mark may be adjacent to the first mark in the first direction and the fourth mark may be adjacent to the second mark in the first direction.

In some example embodiments, the fourth mark may be adjacent to the second mark in the second direction.

In some example embodiments, the third mark may be disposed adjacent to the first mark in the second direction.

In still another example embodiment, a first layer may be formed on a substrate and patterned to form a first mark having first patterns with a first pitch and extending in a first direction. A second layer may be formed on the patterned first layer, and a second mark may be formed on the second layer. The second mark may be adjacent to the first mark. Also, the second mark may have second patterns extending in substantially the same direction as the first direction and having a second pitch substantially equal to the first pitch.

In some example embodiments, the second mark may be adjacent to the first mark in the first direction.

In some example embodiments, the second mark may be adjacent to the first mark in a second direction substantially perpendicular to the first direction.

In some example embodiments, the first and second patterns may be arranged such that each of the first and second marks has a rectangular box shape. Also, the first and second marks may be arranged such that a side portion of the first mark is adjacent to a side portion of the second mark.

In still another example embodiment, a first layer may be formed on a substrate and patterned to form a first mark and a second mark. The first mark may include first patterns extending in a first direction and having a first pitch. The second mark may include second patterns extending in a second direction substantially perpendicular to the first direction and having a second pitch. A second layer may be formed on the patterned first layer. A third mark and a fourth mark may be formed on the second layer. The third mark may be adjacent to the first mark, and the fourth mark may be adjacent to the second mark. The third mark may include third patterns extending in a substantially same direction as the first direction and having a third pitch substantially equal to the first pitch. The fourth mark may include fourth patterns extending in substantially the same direction as the second direction and having a fourth pitch substantially equal to the second pitch.

In some example embodiments, the third mark may be adjacent to the first mark in the first direction, and the fourth mark may be adjacent to the second mark in the first direction.

In some example embodiments, the fourth mark may be disposed adjacent to the second mark in the second direction.

In some example embodiments, the third mark may be disposed adjacent to the first mark in the second direction.

In still another example embodiment, an overlay key may be used for measuring a first layer and a second layer on a substrate. The overlay key may include a first mark formed in the first layer and a second mark formed on the second layer adjacent to the first mark. The first mark may include first patterns extending in a first direction and having a first pitch; and the second mark may include second patterns extending in substantially the same direction as the first direction and having a second pitch substantially equal to the first pitch. A first image and a second image may be acquired from the first mark and the second mark, respectively. A test image may have a third pitch and may be overlaid onto the first and second images. The overlay accuracy between the first and second layers may be produced from position information of a first interference fringe formed by overlaying the test image onto the first image and a second interference fringe formed by overlaying the test image onto the second image.

In some example embodiments, the test image may include a line-and-space pattern extending in substantially the same direction as the first direction.

In some example embodiments, the third pitch may be different from the first pitch and a ratio of the third pitch to the first pitch may be within a range of about 0.5 to about 1.5.

In some example embodiments, the second mark may be disposed adjacent to the first mark in the first direction, and the overlay accuracy may be produced according to a phase difference between the first and second interference fringes.

In some example embodiments, the second mark may be adjacent to the first mark in a second direction substantially perpendicular to the first direction, and the overlay accuracy may be produced according to an angle between the first and second interference fringes.

In some example embodiments, the test image may include a line-and-space pattern extending in a second direction that is tilted with respect to the first direction.

According to the example embodiments, the overlay accuracy may be measured more easily and precisely using interference fringes formed by overlaying the test image onto the images obtained from the marks of the overlay key.

BRIEF DESCRIPTION OF THE DRAWINGS

Example embodiments will become readily apparent by considering the following detailed description of example embodiments in conjunction with the accompanying drawings wherein.

DETAILED DESCRIPTION OF EXAMPLE EMBODIMENTS

Figure 1:
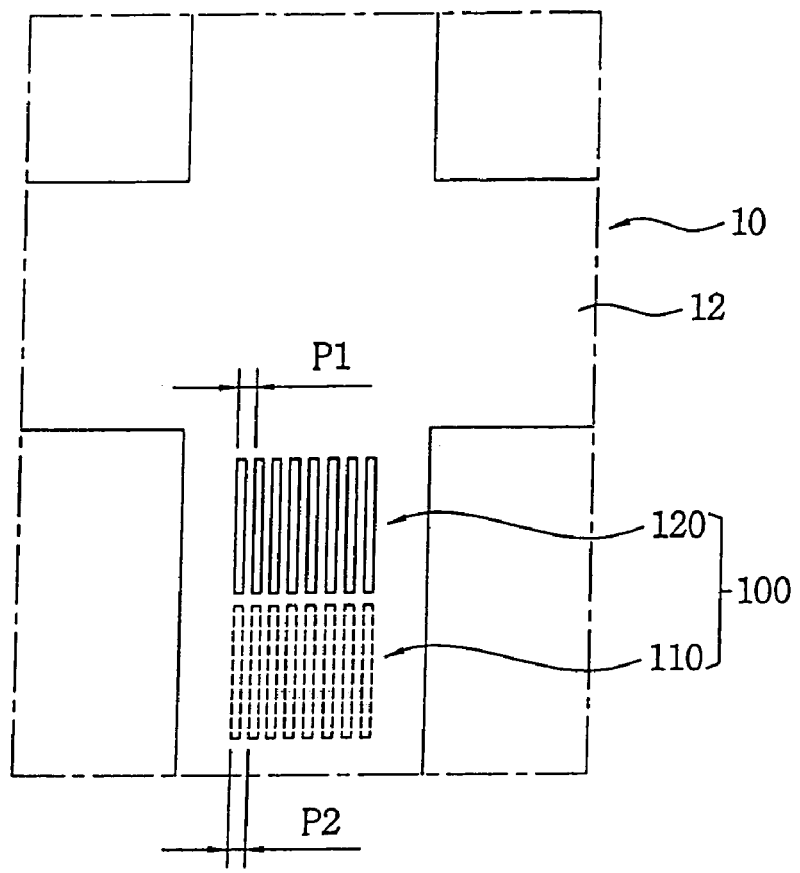
FIG. 1 is a plan view illustrating an example embodiment of an overlay key.

Example embodiments are described more fully hereinafter with reference to the accompanying drawings, in which example embodiments are shown. This invention may, however, be embodied in many different forms and should not be construed as limited to the example embodiments set forth herein. Rather, these example embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Example embodiments are described herein with reference to cross section illustrations that are schematic illustrations of idealized embodiments. As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, example embodiments are explained in detail with reference to the accompanying drawings.

Figure 2:
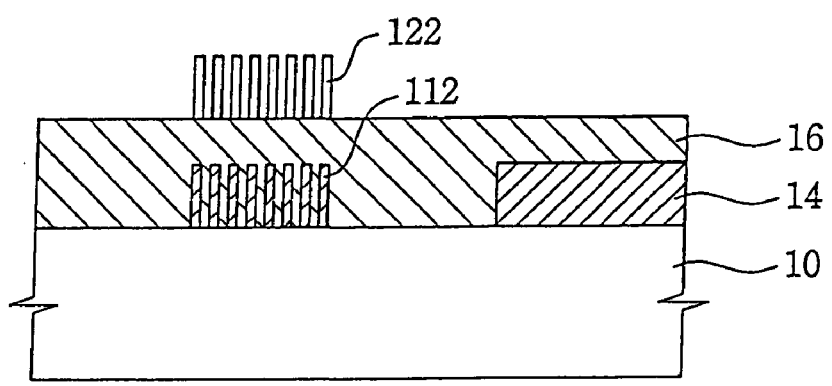
FIGS. 2 and 3 are cross-sectional views illustrating the example embodiment of the overlay key shown in FIG. 1.
Figure 3:
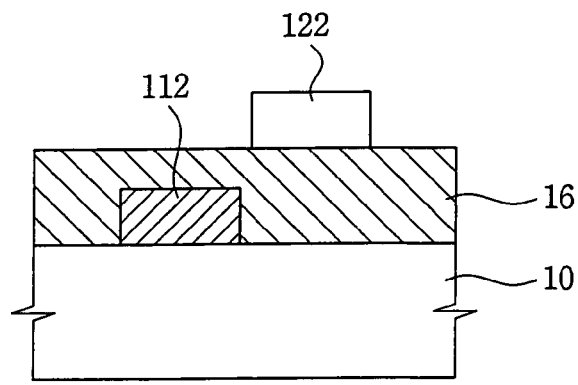

FIG. 1 is a plan view illustrating an example embodiment of an overlay key, and FIGS. 2 and 3 are cross-sectional views illustrating the overlay key shown in FIG. 1.

Referring to FIGS. 1 to 3, a semiconductor substrate 10, for example, a silicon wafer may have a plurality of device forming regions, which may be divided by a plurality of scribe lanes 12. The scribe lanes 12 may intersect at right angles. A first layer 14 and a second layer 16 may be arranged on the substrate 10. An example embodiment of an overlay key 100 may be used for measuring overlay accuracy between a first circuit pattern (not shown) formed in the first layer 14 and a second circuit pattern (not shown) formed in the second layer 16. The overlay key 100 may include a first mark 110 formed in the first layer 14 and a second mark 120 formed on the second layer 16. The overlay key may be formed on the scribe lane 12.

The first mark 110 may include first patterns 112, which may be repeatedly formed in the first layer 14 and may have a first pitch P1. According to an example embodiment, the first mark 110 may have a line-and-space shape extending in a first direction. The first pitch P1 may be within a range of about 200 nm to about 2 μm. For example, the first pitch P1 may be about 1 μm.

The second layer 16 may be formed on the first layer 14. The second mark 120 and a photoresist pattern (not shown) may be formed on the second layer 16. The photoresist pattern may be used as an etching mask in a subsequent patterning process for forming the second circuit pattern.

The second mark 120 may be disposed adjacent to the first mark 110 and may include second patterns 122 that are repeatedly formed on the second layer 16. Further, the second patterns 122 of the second mark 120 may have a second pitch P2 substantially equal to the first pitch P1. The second mark 120 may have a line-and-space shape and may extend in a direction substantially the same as the first direction.

The first patterns 112 and the second patterns 122 may be arranged such that each of the first and second marks 110 and 120 has a rectangular box shape. Further, the first and second marks 110 and 120 may be arranged such that a side portion of the first mark 110 is disposed adjacent to a side portion of the second mark 120. As shown in the example embodiment of FIG. 1, the first mark 110 may be disposed adjacent to the second mark 120 in the first direction.

Figure 4:
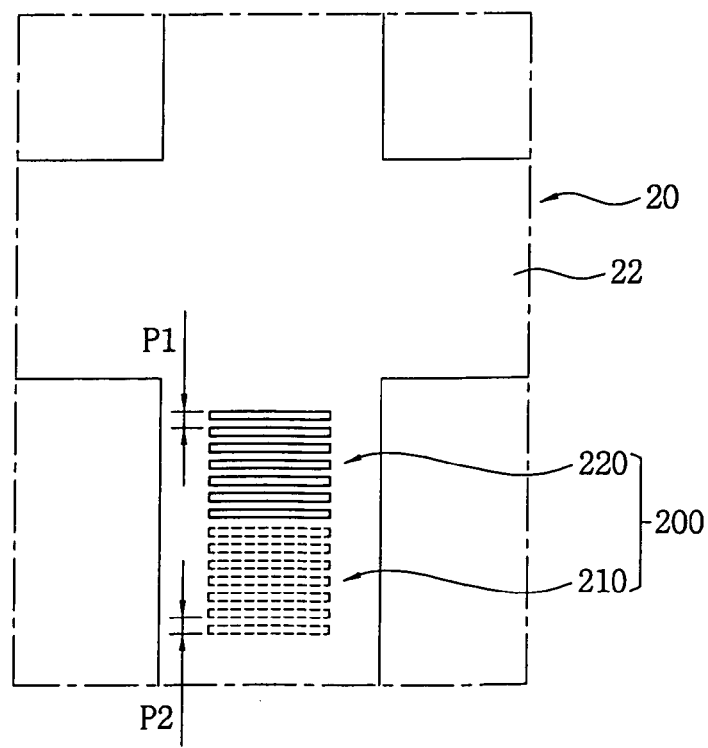
FIG. 4 is a plan view illustrating another example embodiment of an overlay key.
Figure 5:
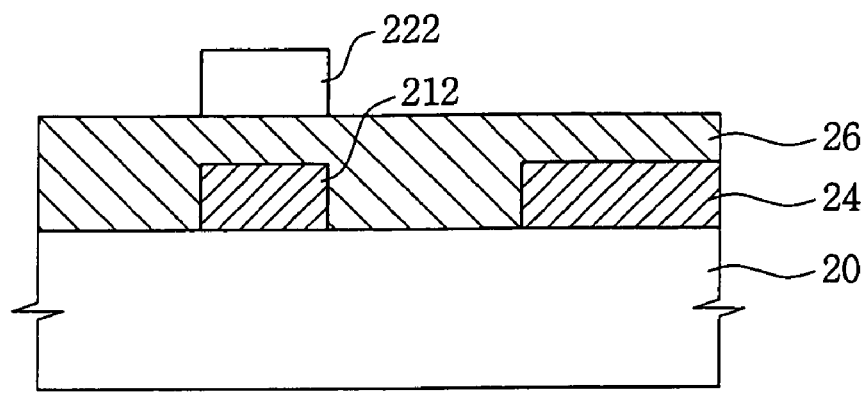
FIGS. 5 and 6 are cross-sectional views illustrating the example embodiment of the overlay key shown in FIG. 4.
Figure 6:
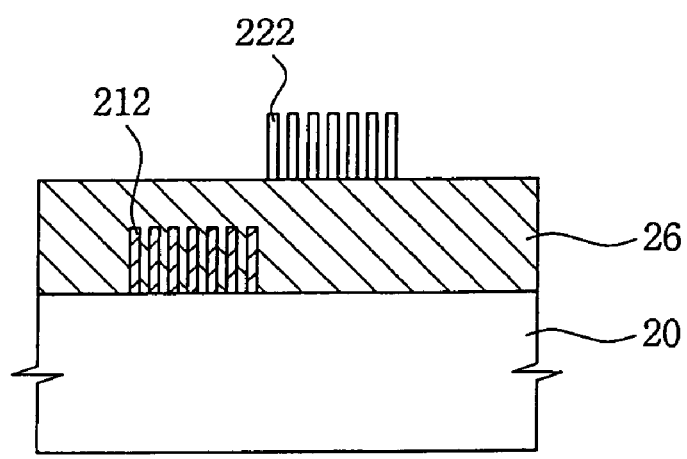

FIG. 4 is a plan view illustrating another example embodiment of an overlay key, and FIGS. 5 and 6 are cross-sectional views of the overlay key shown in FIG. 4.

Referring to FIGS. 4 to 6, a first layer 24 having a first circuit pattern (not shown) may be formed on a semiconductor substrate 20, and a second layer 26 may be formed on the first layer 24. A photoresist pattern (not shown) may be formed on the second layer 26, which may be used for patterning the second layer 26 to form a second circuit pattern (not shown).

An overlay key 200 may be used for measuring overlay accuracy between the first and second circuit patterns. The overlay key 200 may include a first mark 210 formed in the first layer 24 and a second mark 220 formed on the second layer 26. The first and second marks 210 and 220 may be formed on a scribe lane 22 of the substrate 20.

The first mark 210 may include first patterns 212 that are repeatedly formed in a first direction in the first layer 24. The first patterns 212 may have a first pitch P1. The first mark 210 may have a line-and-space shape extending in a second direction substantially perpendicular to the first direction. The first pitch P1 may be within a range of about 200 nm to about 2 μm. For example, the first pitch P1 may be about 1 μm.

The second mark 220 may be disposed adjacent to the first mark 210 and may include second patterns 222 that are repeatedly formed in the first direction. Further, the second mark 220 may have a second pitch P2 substantially equal to the first pitch P1. The second mark 220 may have a line-and-space shape extending in the second direction.

The first patterns 212 and second patterns 222 may be arranged such that the first mark 210 and second mark 220 each have a rectangular box shape. The first mark 210 may be disposed adjacent to the second mark 220 in the first direction.

Figure 7:
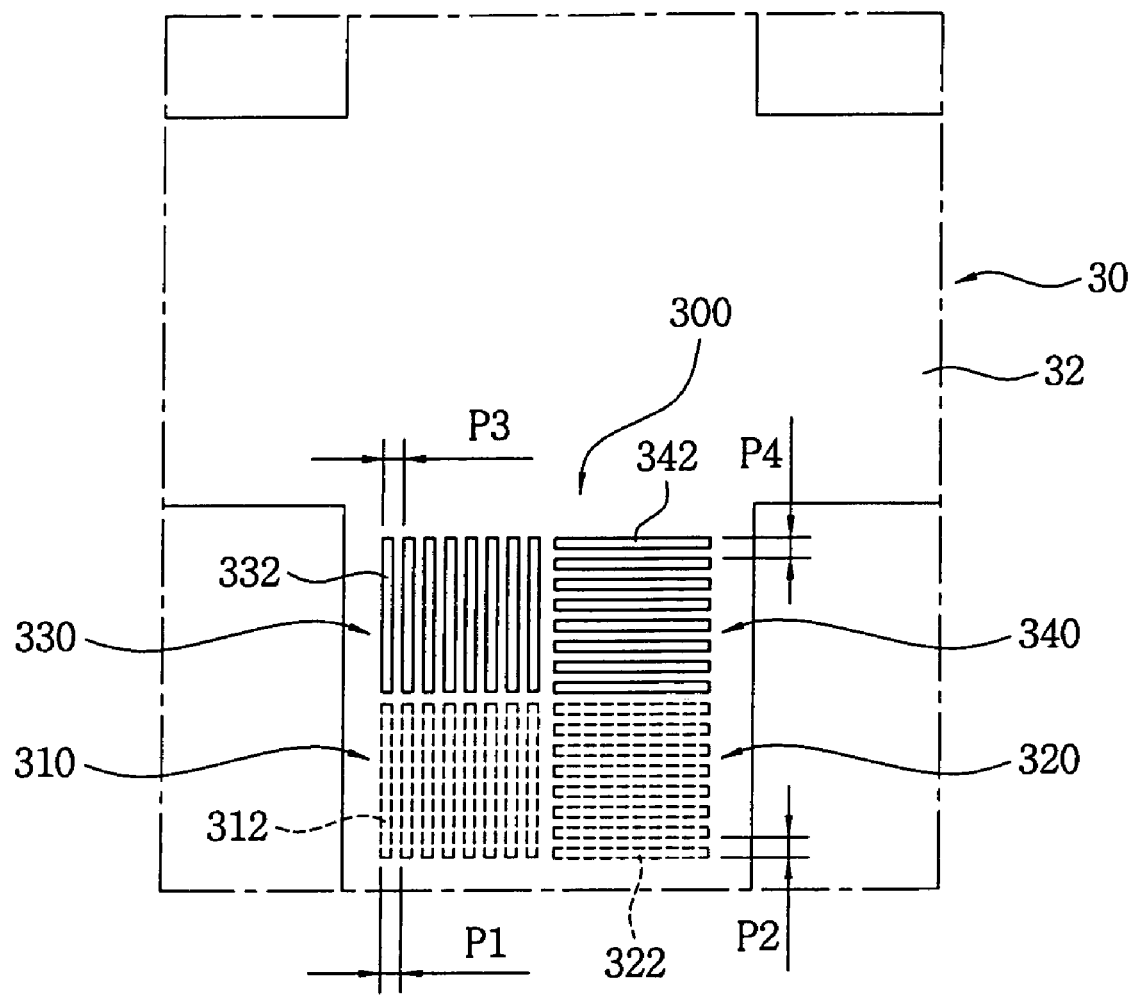
FIGS. 7 to 9 are plan views illustrating additional example embodiments of overlay keys.

FIG. 7 is a plan view illustrating still another example embodiment of an overlay key.

Referring to FIG. 7, a first layer having a first circuit pattern may be formed on a semiconductor substrate 30, and a second layer to be patterned may be formed on the first layer. A photoresist pattern may be formed on the second layer, which may be used as etching mask during a patterning process of the second layer. An overlay key 300 may be formed on a scribe lane 32 of the substrate 30. In addition, the overlay key 300 may include first and second marks 310 and 320 formed in the first layer, and third and fourth marks 330 and 340 formed on the second layer.

The first mark 310 may include first patterns 312 extending in a first direction and having a first pitch P1. The second mark 320 may include second patterns 322 extending in a second direction substantially perpendicular to the first direction and having a second pitch P2. The first pitch P1 may be substantially equal to the second pitch P2. However, the first pitch P1 may be different from the second pitch P2 according to alternative example embodiments.

The third mark 330 may be formed on the second layer adjacent to the first mark 310 and may include third patterns 332 extending in substantially the same direction as the first direction. Further, the third mark 330 may have a third pitch P3 substantially equal to the first pitch P1.

The fourth mark 340 may be formed on the second layer adjacent to the second mark 320 and may include fourth patterns 342 extending in substantially the same direction as the second direction. Further, the fourth patterns 342 of the fourth mark 340 may have a fourth pitch P4 substantially equal to the second pitch P2.

As shown in figures, the third and fourth marks 330 and 340 may be disposed adjacent to the first and second marks 310 and 320 in the first direction.

However, the third mark 330 may be disposed adjacent to the first mark 310 and have third patterns 332 extending in the first direction, and the fourth mark 340 may be disposed adjacent to the second mark 320 and have fourth patterns 342 extending in the second direction. Further, the third mark 330 may be disposed adjacent to the fourth mark 340 in the second direction, and the fourth mark 340 may be disposed adjacent to the second mark 320 in the first direction.

Figure 8:
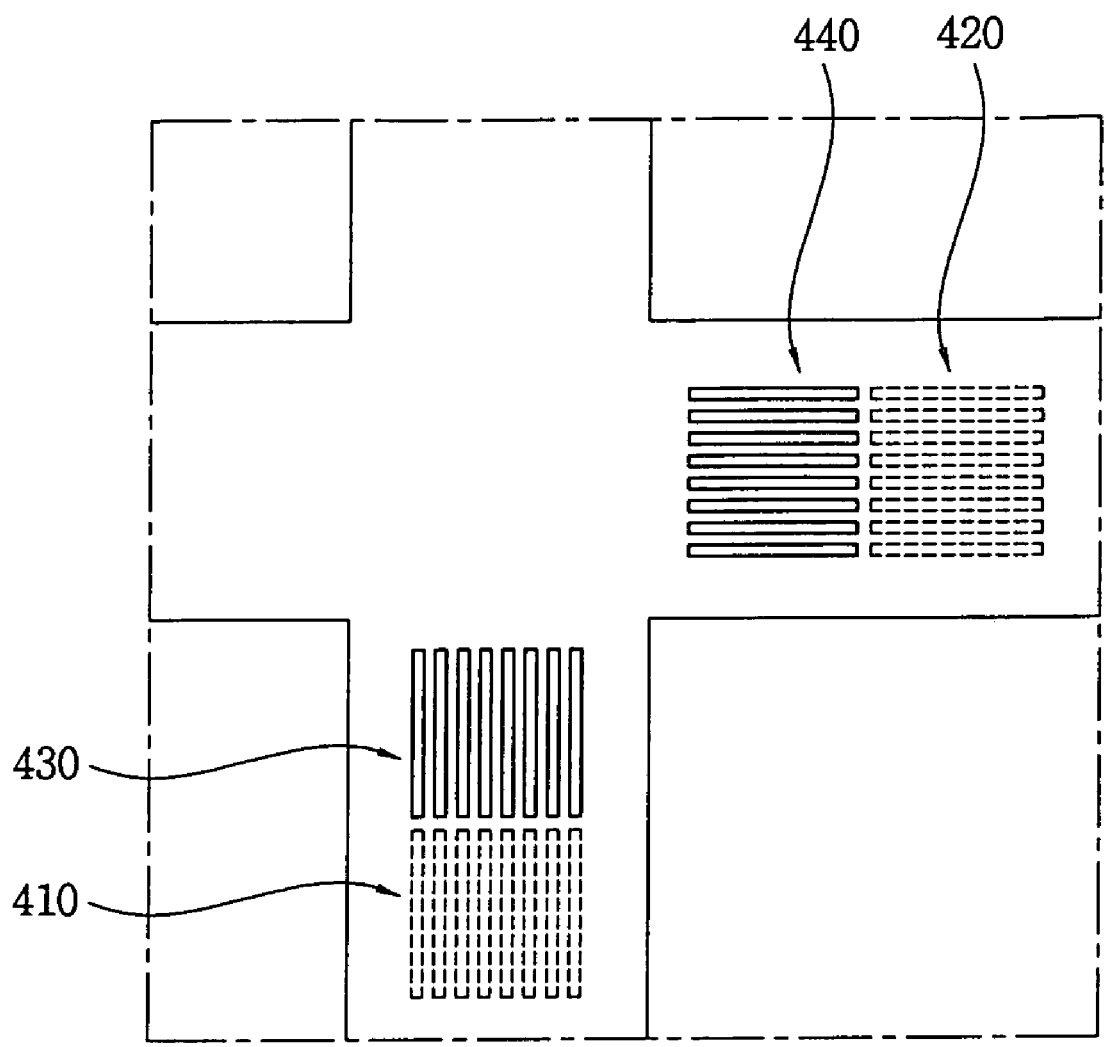
Figure 9:
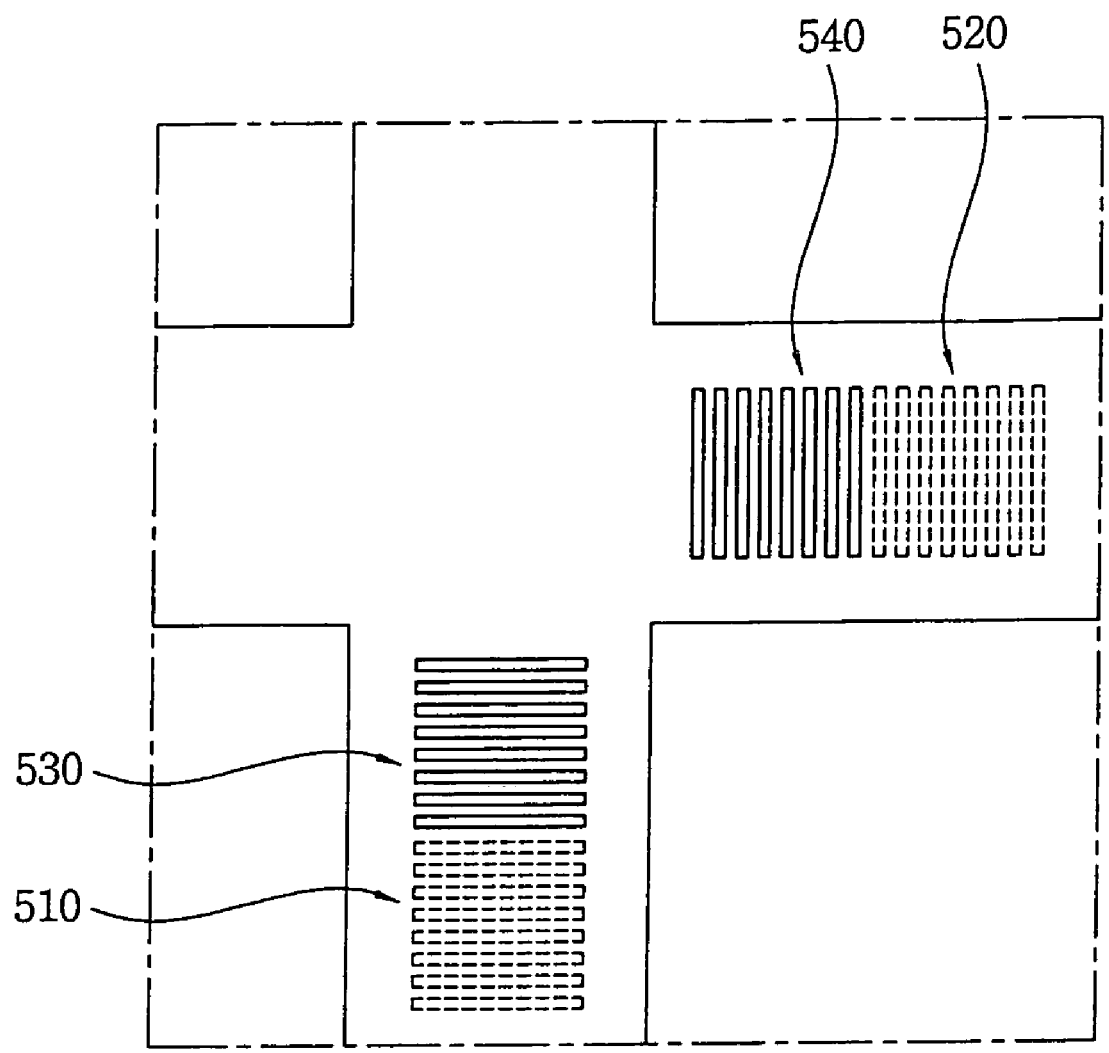

Moreover, the marks may be disposed in different configurations, and examples of the configurations and relations of the marks are shown in FIGS. 8 and 9.

Referring to FIG. 8, a first mark 410 may be disposed on a first scribe lane extending in a first direction, and a second mark 420 may be disposed on a second scribe lane extending in a second direction substantially perpendicular to the first direction. The first mark 410 may extend in the first direction, and the second mark 420 may extend in the second direction.

A third mark 430 may be disposed adjacent to the first mark 410 in the first direction, and a fourth mark 440 may be disposed adjacent to the second mark 420 in the second direction. Further, the third mark 430 may extend in the first direction, and the fourth mark 440 may extend in the second direction.

Referring to FIG. 9, a first mark 510 may be disposed on a first scribe lane extending in a first direction, and a second mark 520 may be disposed on a second scribe lane extending in a second direction substantially perpendicular to the first direction. The first mark 510 may extend in the second direction, and the second mark 520 may extend in the first direction.

A third mark 530 may be disposed adjacent to the first mark 510 in the first direction, and a fourth mark 540 may be disposed adjacent to the second mark 520 in the second direction. Further, the third mark 530 may extend in the second direction, and the fourth mark 540 may extend in the first direction.

FIGS. 10 to 13 are plan views and cross-sectional views illustrating a method of forming example embodiments of overlay keys such as the example embodiment of the overlay key shown in FIG. 7, for example.

Figure 10:
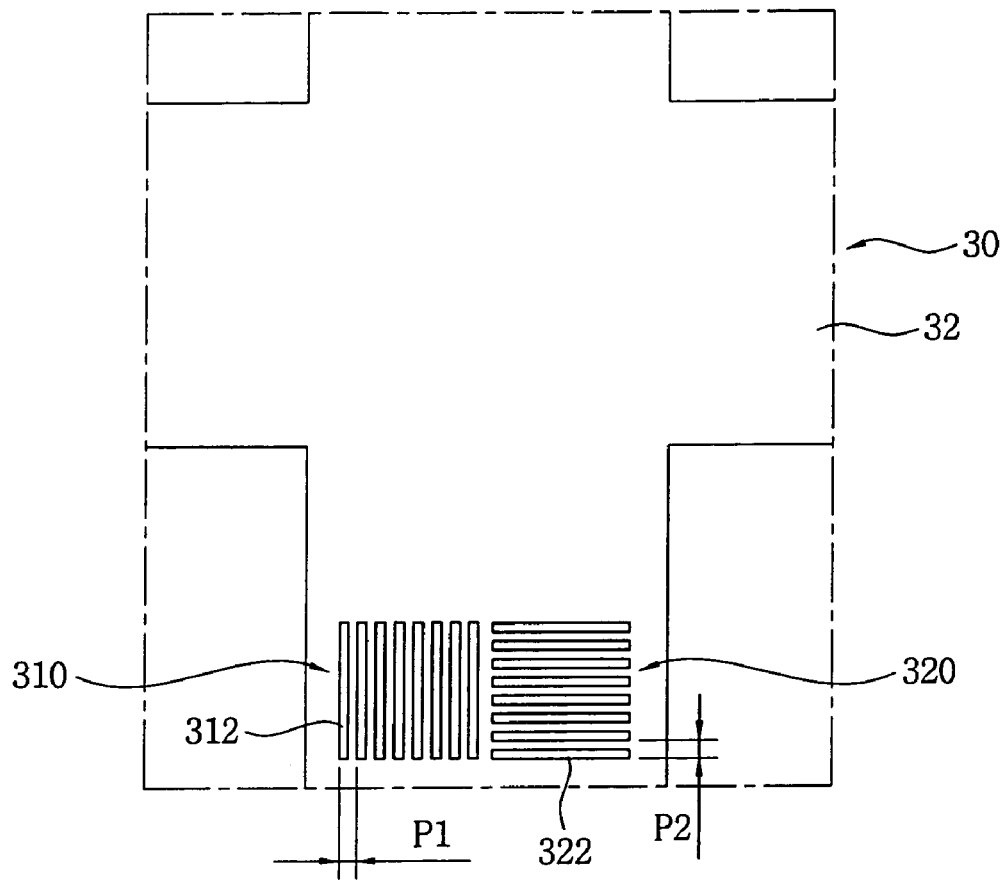
FIGS. 10 to 13 are plan views and cross-sectional views illustrating an example embodiment of a method of forming the overlay key shown in FIG. 7.
Figure 11:
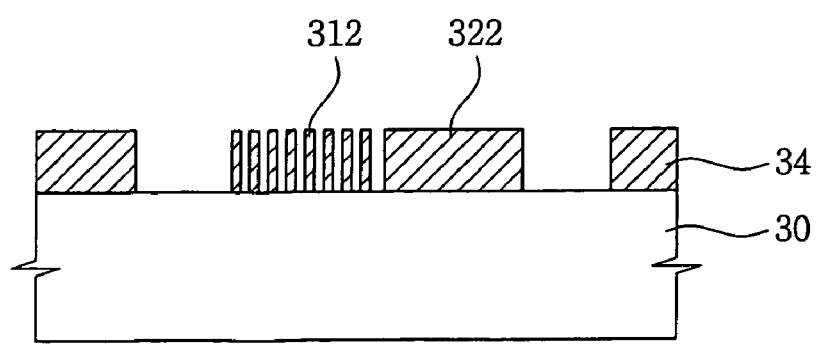

Referring to FIGS. 10 and 11, a first layer 34 may be formed on a semiconductor substrate 30. The first layer 34 may have a first circuit pattern (not shown) and first and second marks 310 and 320. The first and second marks 310 and 320 may be used for measuring overlay accuracy. The first layer may include conductive material or insulating material and may be formed using one or more layer formation processes including, but not limited to, a chemical vapor deposition process, a physical vapor deposition process, an atomic layer deposition process, etc.

A mask pattern may be formed on the first layer 34 and then, the first circuit pattern, the first mark 310 and the second mark 320 may be formed by an anisotropic etching process using the mask pattern as an etching mask. The mask pattern may be a photoresist pattern. Alternatively, the mask pattern may be a nitride layer pattern formed using the photoresist pattern.

The first and second marks 310 and 320 may be formed on a scribe lane 32 of the substrate 30. The first mark 310 may extend in a first direction and may include first patterns 312 having a line-and-space shape. The first patterns 312 of the first mark 310 may have a first pitch P1. The second mark 320 may extend in a second direction substantially perpendicular to the first direction. The second mark 320 may include second patterns having a line-and-space shape and a second pitch P2.

Figure 12:
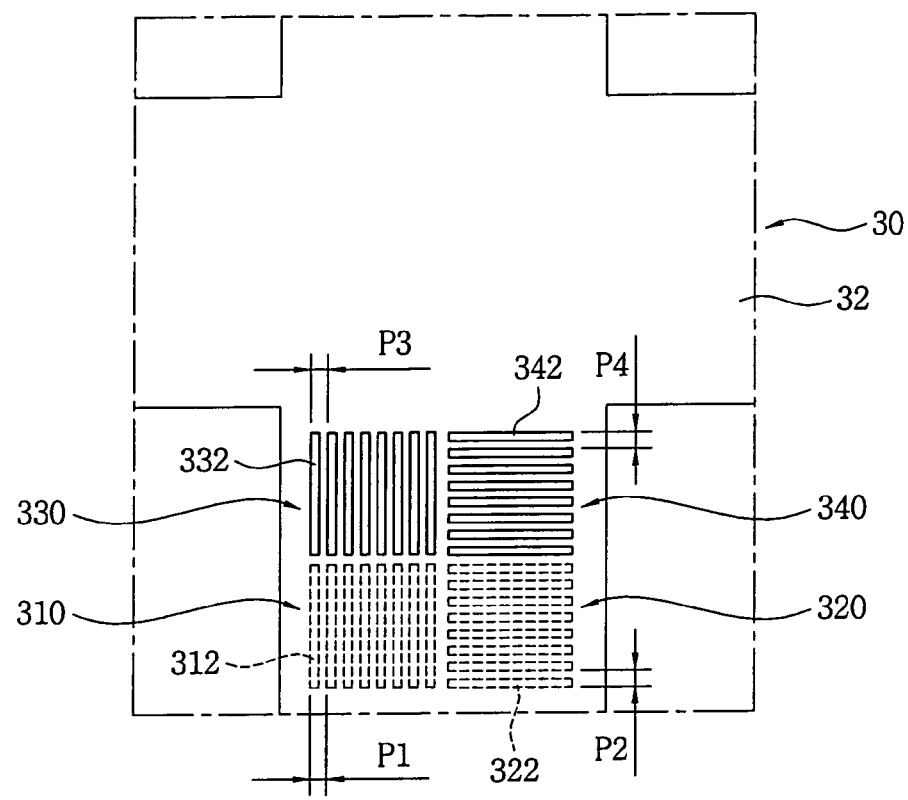
Figure 13:
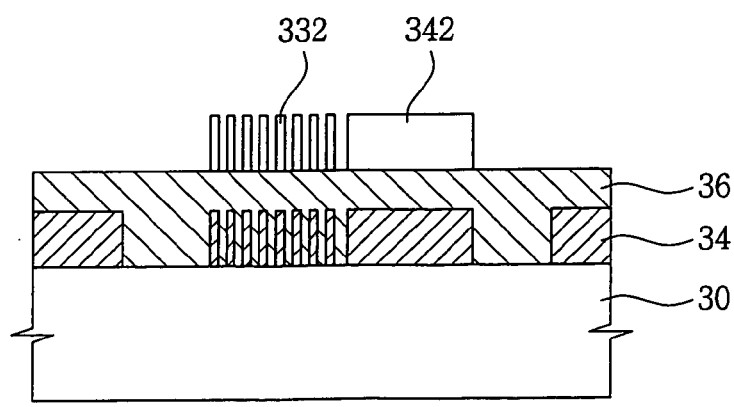

Referring to FIGS. 12 and 13, a second layer 36 may be formed on the first layer 34. Then, a photoresist pattern (not shown) for patterning the second layer 36, as well as third and fourth marks 330 and 340 for measuring the overlay accuracy may be formed on the second layer 36. A second circuit pattern may be formed in the second layer 36 by patterning the second layer 36. The first, second, third and fourth marks 310, 320, 330 and 340 may be used for measuring the overlay accuracy between the first and second circuit patterns before forming the second circuit pattern.

The third and fourth marks 330 and 340 may include photoresist and may be disposed adjacent to the first and second marks 310 and 320, respectively.

The third mark 330 may include third patterns 332 extending in substantially the same direction as the first direction and having a third pitch P3 substantially equal to the first pitch P1. The fourth mark 340 may include fourth patterns extending in substantially the same direction as the second direction and having a fourth pitch P4 substantially equal to the second pitch P2.

The second layer 36 may include conductive material or insulating material and may be formed by a layer formation process well known to those skilled in the art. The photoresist pattern, the third mark 330 and the fourth mark 340 may be formed by a photolithography process well known to those skilled in the art.

Figure 14:
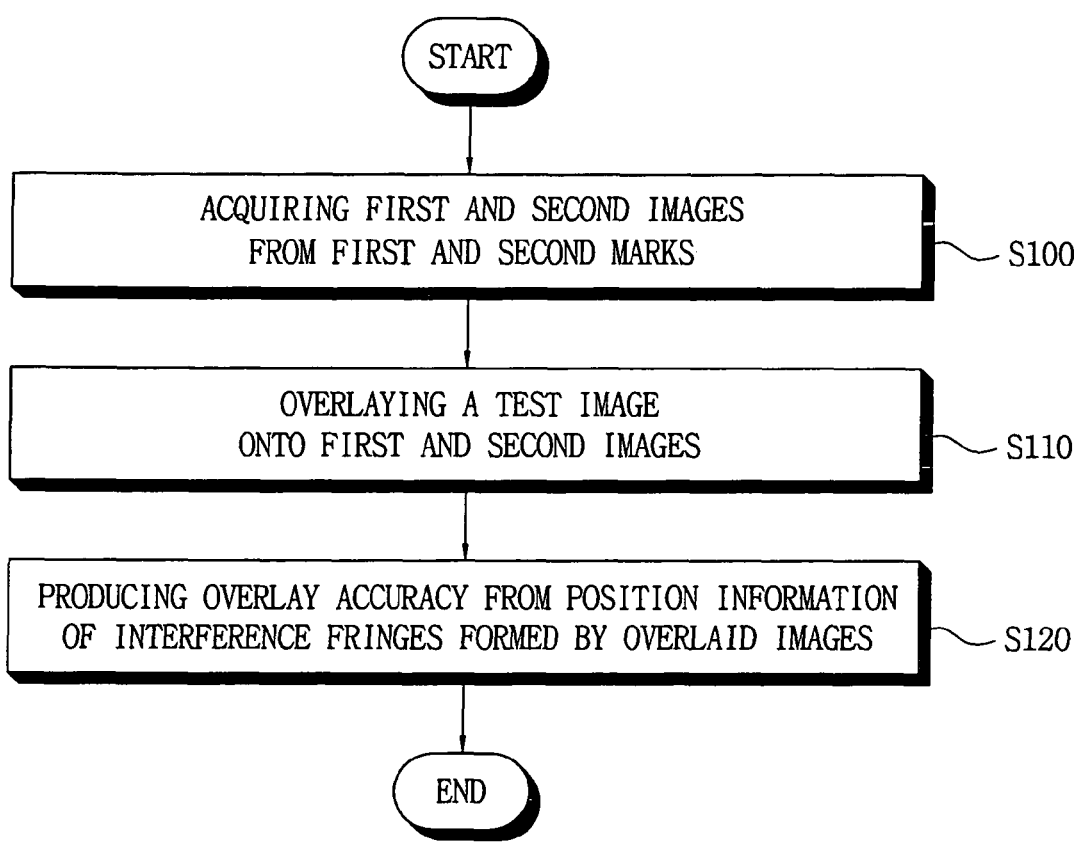
FIG. 14 is a flow chart illustrating an example embodiment of a method of measuring overlay accuracy using the overlay key shown in FIG. 1.
Figure 15:
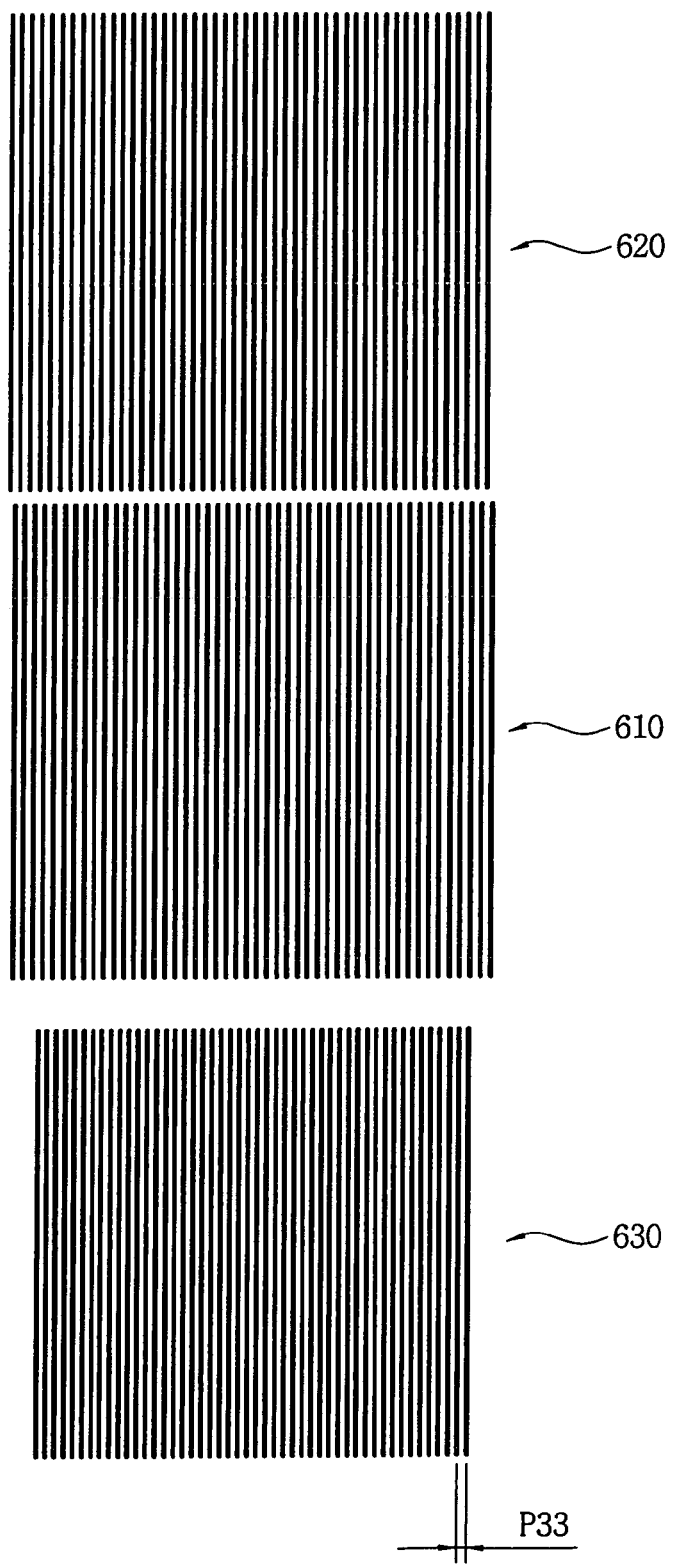
FIG. 15 is a schematic view illustrating an example test image, and example first and second images acquired from the first and second marks shown in FIG. 1.
Figure 16:
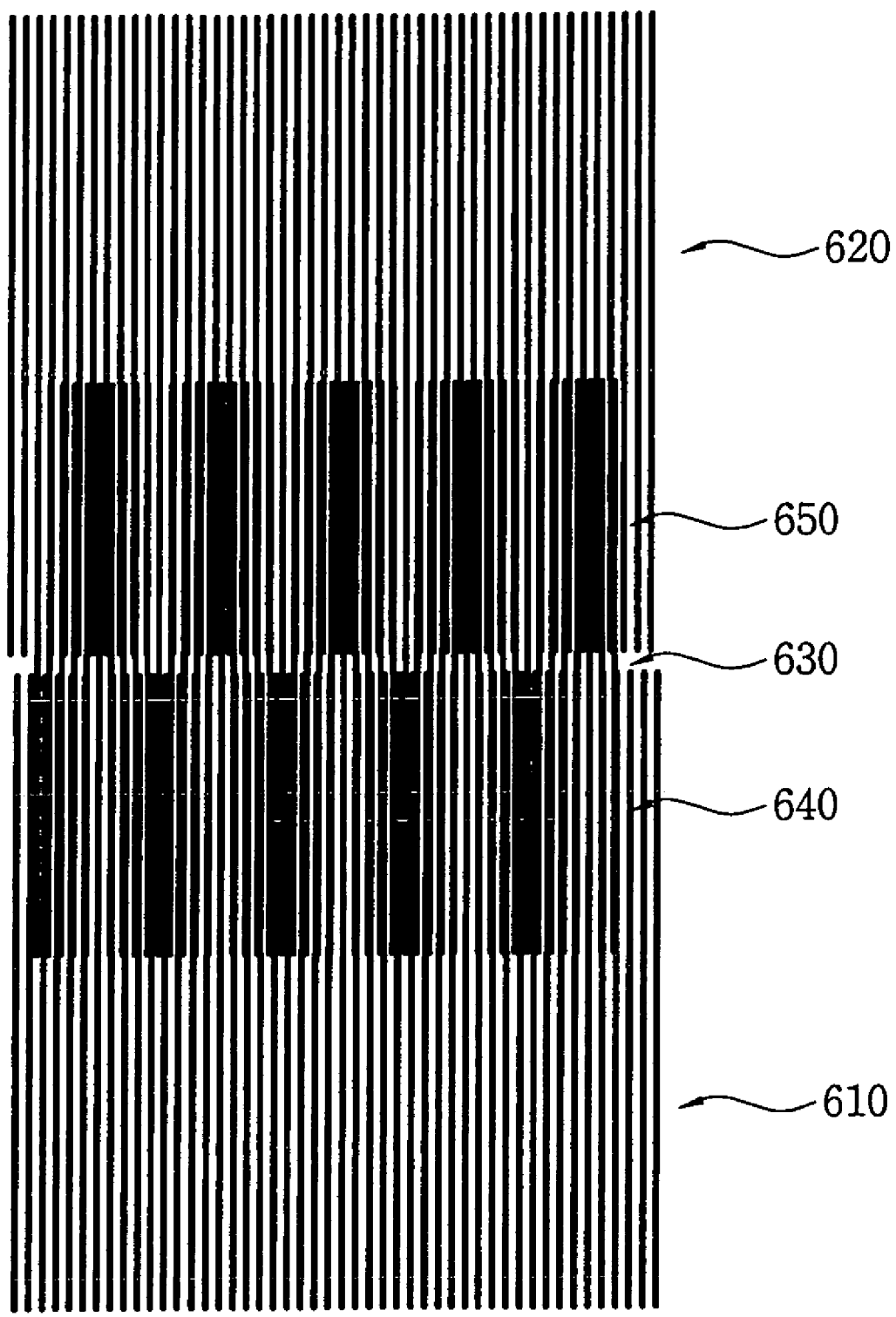
FIG. 16 is a schematic view illustrating example first and second interference fringes formed by overlaying the test image onto the first and second images shown in FIG. 15.

FIG. 14 is a flow chart illustrating a method of measuring overlay accuracy using an example embodiment of an overlay key such as the overlay key shown in FIG. 1, for example. FIG. 15 is a schematic view illustrating a test image, and example first and second images acquired from first and second marks 110 and 120 shown in FIG. 1. FIG. 16 is a schematic view illustrating example first and second interference fringes formed by overlaying the test image onto the first and second images as shown in FIG. 15.

Referring to FIGS. 1 and 14 to 16, a first image 610 and a second image 620 may be acquired from the first and second marks 110 and 120 formed on the substrate 10 (S100). The first and second images 610 and 620 may be acquired by an optical microscope, for example.

The first mark 110 may include first patterns 112 extending in a first direction and having a line-and-space shape and a first pitch P1. The second mark 120 may include second patterns 122 extending in substantially the same direction as the first direction and having a line-and-space shape and a second pitch P2 substantially equal to the first pitch P1.

A test image 630 may be overlaid onto the first and second images 610 and 620 (S110). The test image may include an image corresponding to a line-and-space pattern extending in substantially the same direction as the first direction and having a fifth pitch P33 different from the first pitch P1. Particularly, a ratio of the fifth pitch P33 to the first pitch P1 may be within a range of about 0.5 to about 1.5. For example, if the first pitch is about 1 μm, the fifth pitch P33 is within a range of about 0.5 μm to about 1.5 μm. According to another example embodiment, if the first pitch P1 is about 1 μm, the fifth pitch P33 may be set within a range of about 0.8 μm to about 1.2 μm.

According to an example embodiment, a first interference fringe 640 may be formed by overlaying the test image 630 onto the first image 610 and a second interference fringe 650 may be formed by overlaying the test image 630 onto the second image 620 (S110). The first and second interference fringes 640 and 650 may be formed according to a difference between the first pitch P1 and fifth pitch P33. The overlay accuracy may be produced from position information of the first and second interference fringes 640 and 650 (S120).

Each of the first and second interference fringes 640 and 650 may have a regularly repeated pattern. However, the second interference fringe 650 may shift in a second direction substantially perpendicular to the first direction with respect to the first interference fringe 640 in accordance with the overlay accuracy between the first and second marks 110 and 120. That is, the overlay accuracy may be produced from a phase difference between the first and second interference fringes 640 and 650.

If the second mark 120 shifts by the first pitch P1 from the first mark 110 in the second direction, the phase difference does not occur between the first and second interference fringes 640 and 650. Thus, a measurement range of the overlay accuracy using the first and second interference fringes 640 and 650 may be smaller than the first pitch P1.

Thus, the overlay accuracy measurement using the phase difference between the first and second interference fringes 640 and 650 may be desirably performed after an overlay accuracy measurement using the first and second images 610 and 620 is performed according to an example embodiment. In detail, the overlay accuracy may be produced more precisely by first measuring misalignment between the first and second marks 110 and 120 using the first and second images 610 and 620, and second producing misalignment between the first and second marks 110 and 120 using the first and second interference fringes 640 and 650.

Figure 17:
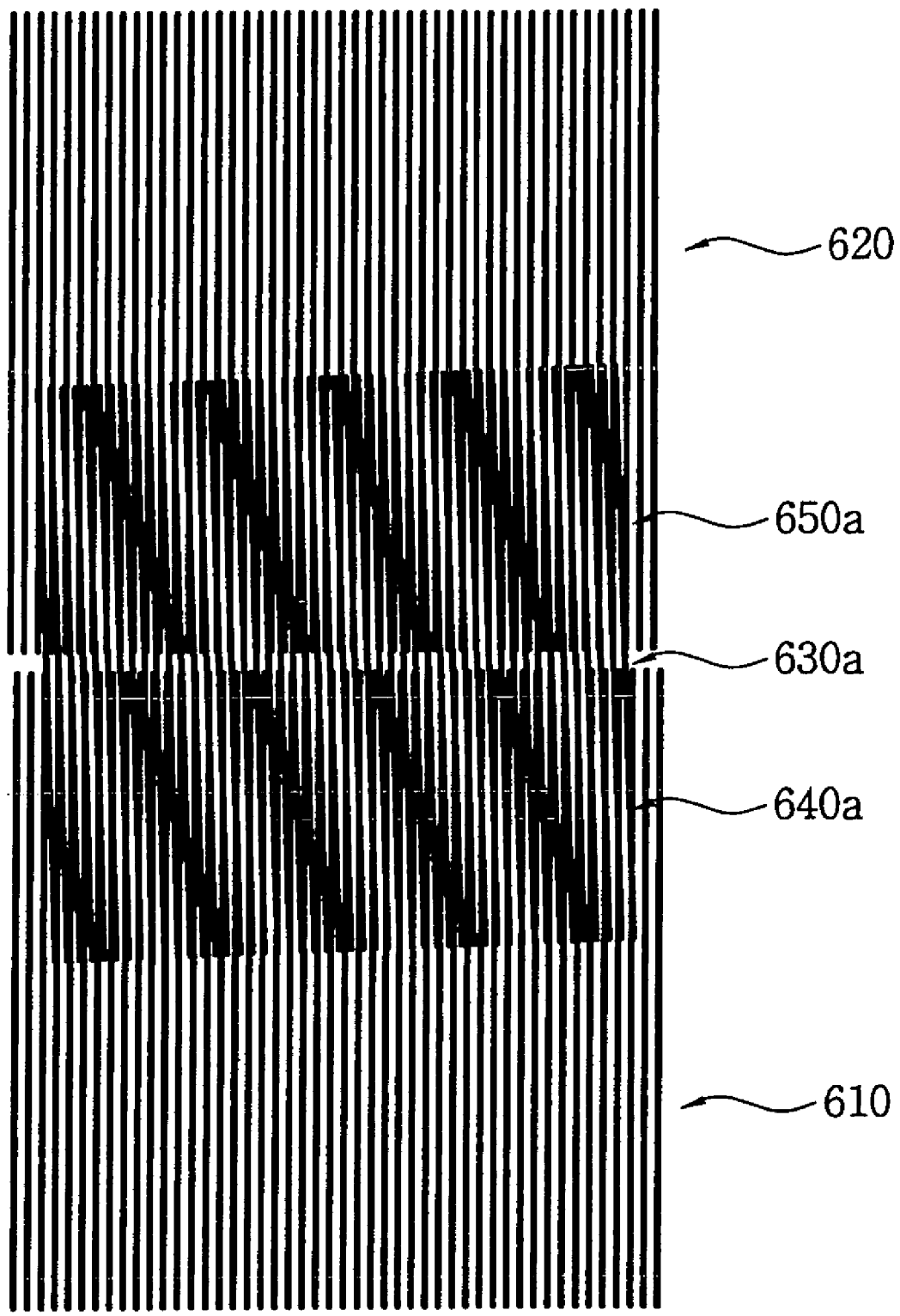
FIG. 17 is a schematic view illustrating another example of first and second interference fringes formed by overlaying the test image onto the first and second images shown in FIG. 15.

FIG. 17 is a schematic view illustrating another example of first and second interference fringes formed by overlaying the test image onto the example first and second images shown in FIG. 15.

Referring to FIG. 17, a test image 630a is tilted at approximately 2° with respect to the extension direction (e.g., the first direction) of the first image 610. The overlay accuracy in the second direction may be produced from the phase difference between first and second interference fringes 640a and 650a formed by overlaying the tilted test image 630a onto the first and second images 610 and 620 according to an example embodiment.

In an example using a tilted test image 630a, the tilted test image 630a may have a fifth pitch P33 substantially equal to the first pitch P1. Further, the tilt angle of the tilted test image 630a may be suitably determined to improve a reliability of the overlay accuracy measurement.

Figure 18:
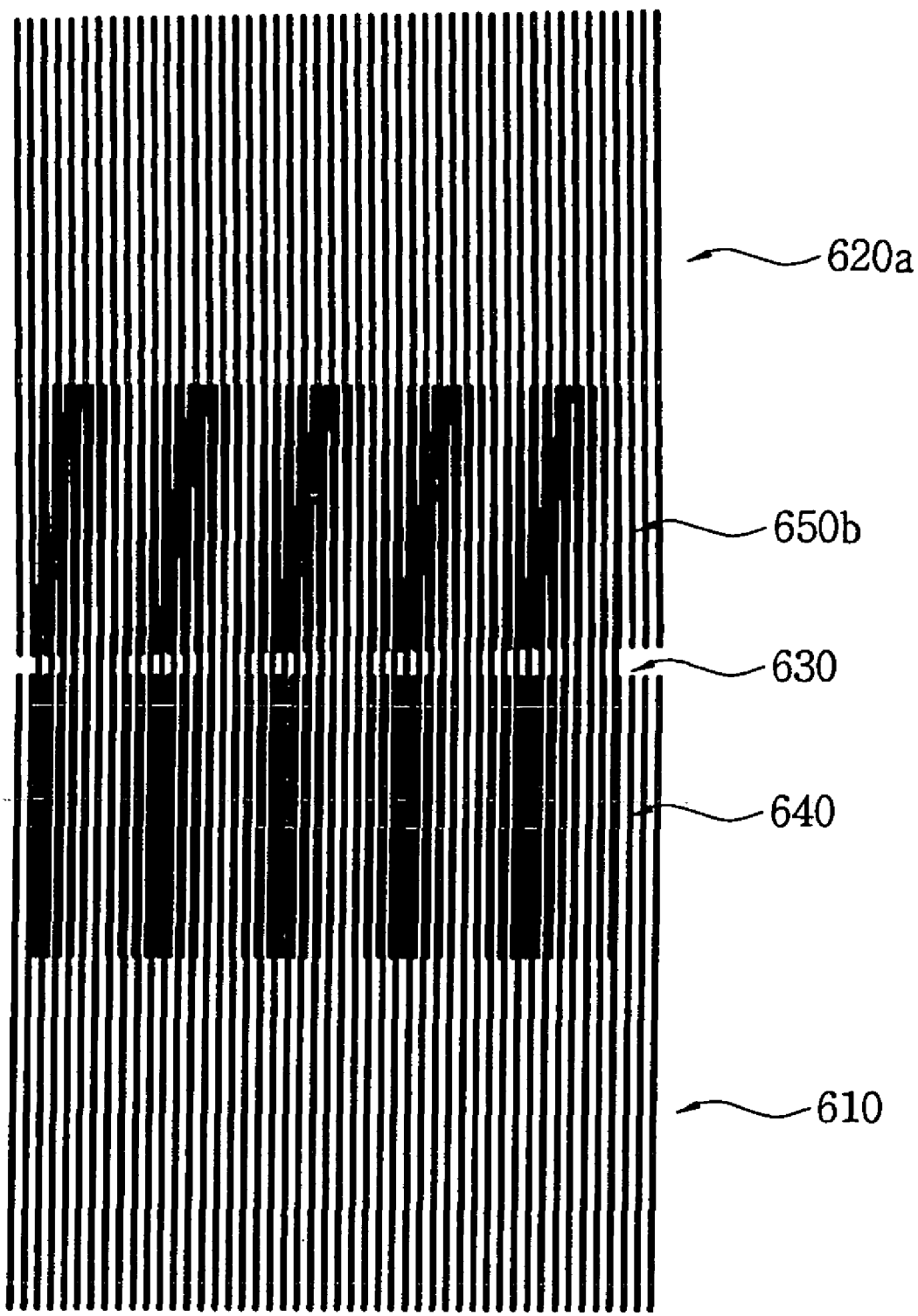
FIG. 18 is a schematic view illustrating variation of the example interference fringes according to rotation of a second mark of the overlay key shown in FIG. 1.

FIG. 18 is a schematic view illustrating variation of interference fringes according to rotation of a second mark of the example embodiment of the overlay key shown in FIG. 1.

As shown in FIG. 18, if the second mark 120 is rotated by approximately 1° with respect to the first mark 110, the overlay accuracy may be readily produced using the first interference fringe 640 and a second interference fringe 650b that is formed by overlaying the test image 630 onto the first image 610 and the rotated image 620a. In detail, the overlay accuracy may be produced from an angle between extension directions of the first and second interference fringes 640 and 650b.

Figure 19:
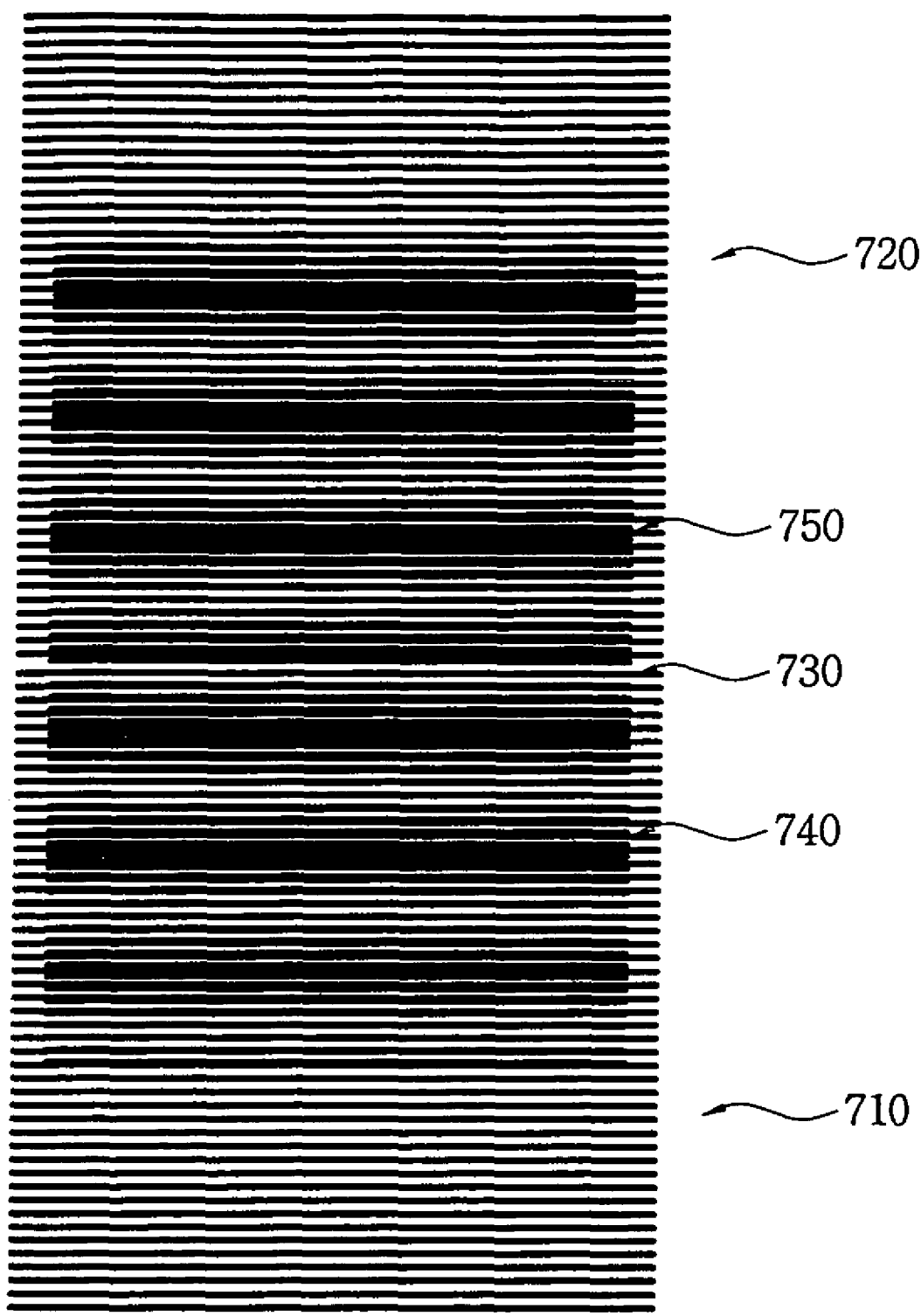
FIG. 19 is a schematic view illustrating example first and second interference fringes formed by overlaying an example test image onto the example first and second images acquired from the first and second marks shown in FIG. 3.

FIG. 19 is a schematic view illustrating first and second interference fringes formed by overlaying a test image onto first and second images acquired from example first and second marks shown in FIG. 3.

Referring to FIG. 19, a first image 710 acquired from the first mark 210 shown in FIG. 3 may extend in a second direction and have a first pitch P1. A second image 720 acquired from the second mark 220 shown in FIG. 3 may extend in substantially the same direction as the second direction and may have a second, pitch P2 substantially equal to the first pitch P1. The first image 710 may be disposed adjacent to the second image 720 in a first direction substantially perpendicular to the second direction.

A test image may extend in the second direction and may have a fifth pitch P33 different from the first pitch P1. In an example embodiment of overlaying the test image 730 onto the first and second images 710 and 720, misalignment between the first and second images 710 and 720 may be produced from variation of a period between first and second interference fringes 740 and 750.

Figure 20:
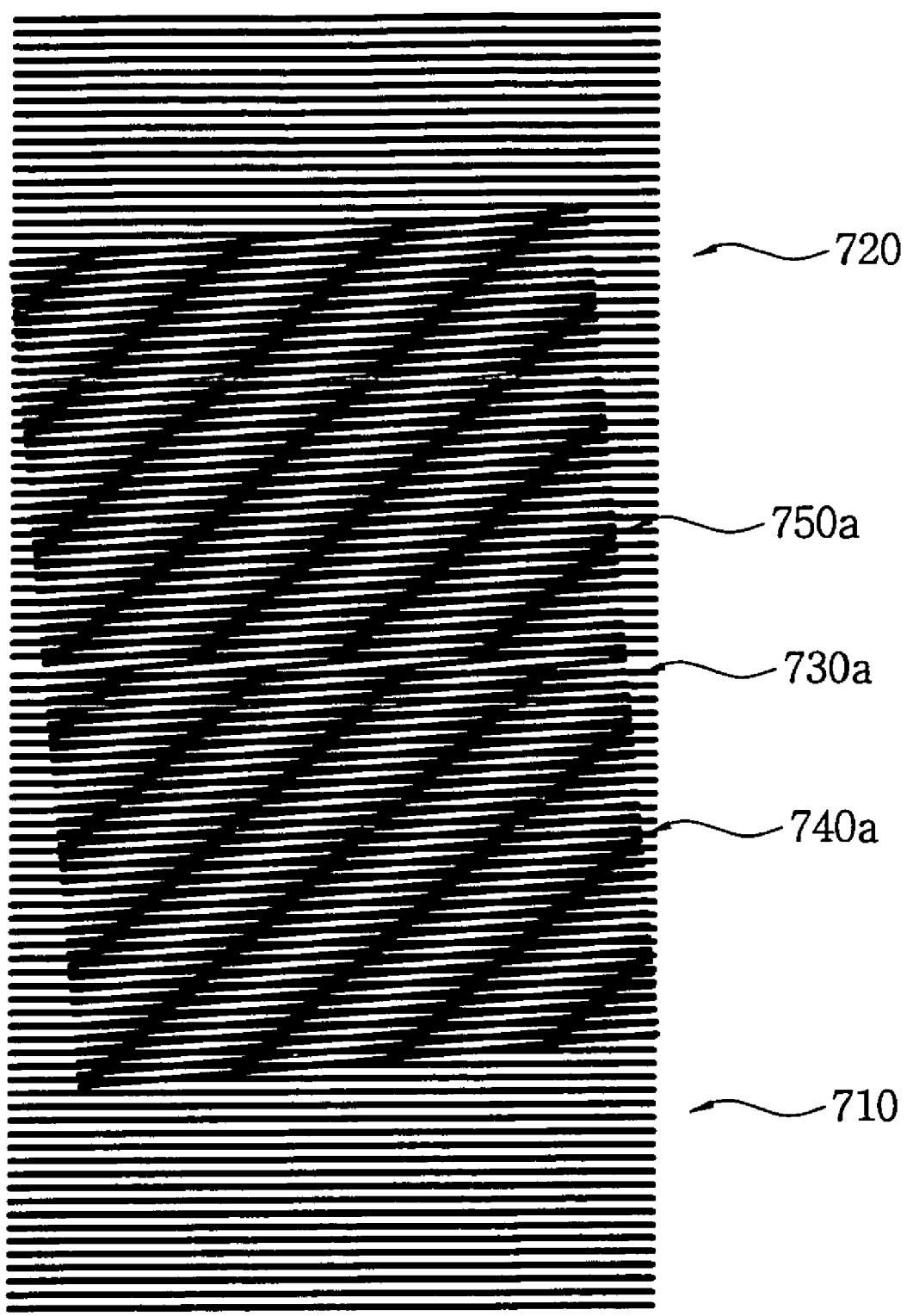
FIG. 20 is a schematic view illustrating another example of first and second interference fringes formed by overlaying an example test image onto the example first and second images acquired from first and second marks shown in FIG. 3.

FIG. 20 is a schematic view illustrating another example embodiment of first and second interference fringes formed by overlaying a test image onto first and second images acquired from example first and second marks shown in FIG. 3.

Referring to FIG. 20, a test image 730a may be tilted by approximately 50 with respect to the extension direction (e.g., the second direction) of the first image 710. The overlay accuracy in the first direction substantially perpendicular to the second direction may be produced from the phase difference between the first and second interference fringes 740a and 750a formed by overlaying the tilted test image 730a onto the first and second images 710 and 720. In detail, the phase difference may be varied in accordance with a distance between the first and second images 710 and 720. Thus, the overlay accuracy in the first direction may be easily produced according to the phase difference. In example embodiments, the tilted test image 730a may have a pitch substantially equal to that of the first or second image.

Figure 21:
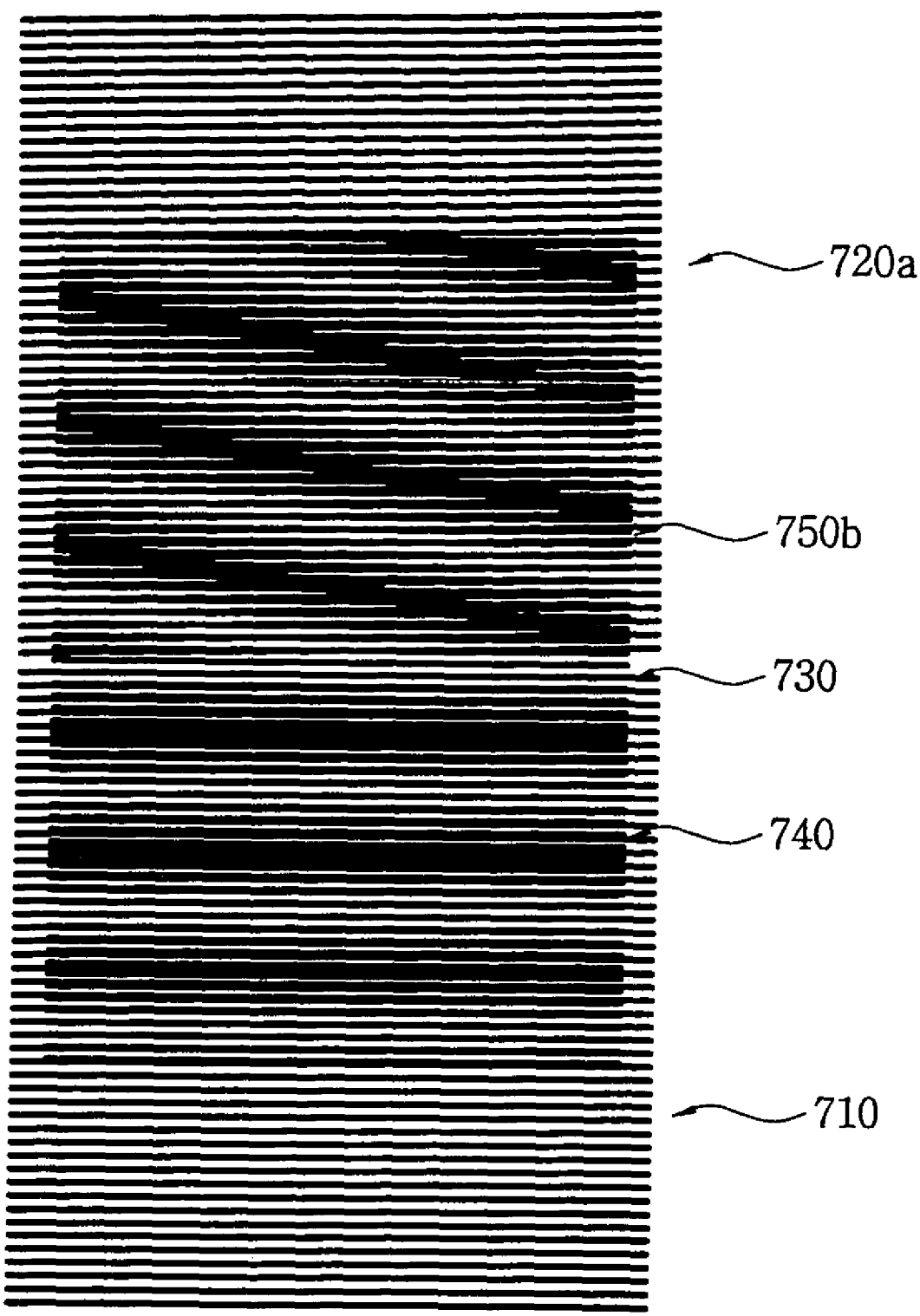
FIG. 21 is a schematic view illustrating variation of the example interference fringes according to rotation of a second mark of the example embodiment of the overlay key shown in FIG. 3.

FIG. 21 is a schematic view illustrating variation of interference fringes according to rotation of a second mark of the example embodiment of the overlay key shown in FIG. 3.

As shown in FIG. 21, if the second mark 220 is rotated by approximately 10 with respect to the first mark 210, the overlay accuracy may be produced from first and second interference fringes 740 and 750b formed by overlaying the test image 730 onto the first image 710 and the rotated second image 720a.

Further detailed descriptions on methods of measuring overlay accuracy using the overlay keys as shown in FIGS. 7 to 9 will be omitted because these methods are similar to those already described with reference to FIGS. 15 to 21.

In accordance with the example embodiments, the overlay accuracy may be measured more precisely and easily using the interference fringes formed by overlaying the test image onto the images acquired from the marks of the overlay key.

Although example embodiments have been described above, it is understood that the present invention should not be limited to these example embodiments but various changes and modifications can be made by those skilled in the art within the spirit and scope of the present invention as hereinafter claimed.

What is claimed is:

1. A method of measuring overlay accuracy between a first layer and a second layer on a substrate, the method comprising:

acquiring a first image and a second image from a first mark formed on the first layer and a second mark formed on the second layer;

overlaying a test image onto the first image and the second image; and producing the overlay accuracy between the first layer and the second layer from position information of a first interference fringe formed by overlaying the test image onto the first image and a second interference fringe formed by overlaying the test image onto the second image.

2. The method of claim 1, wherein the test image includes a line-and-space pattern extending in a second direction tilted with respect to a first direction.

3. The method of claim 1, wherein the test image includes a line-and-space pattern extending in a first direction.

4. The method of claim 3, wherein the first mark and second mark have patterns with a first pitch, the line-and-space pattern of the test image has a third pitch and a ratio of the third pitch to the first pitch is within a range of about 0.5 to about 1.5.

5. The method of claim 3, wherein the second mark is disposed adjacent to the first mark in a second direction substantially perpendicular to the first direction.

6. The method of claim 3, wherein the second mark is disposed adjacent to the first mark in the first direction.

7. The method of claim 6, wherein the overlay accuracy is produced according to a phase difference between the first and second interference fringes.

8. The method of claim 5, wherein the overlay accuracy is produced according to an angle between the first and second interference fringes.

* * * * *